United States Patent
Bi et al.

(10) Patent No.: US 9,954,487 B1
(45) Date of Patent: Apr. 24, 2018

(54) TUNING LC TANK CIRCUITS

(71) Applicant: International Business Machines Corporation, Armonk, NY (US)

(72) Inventors: Zhenxing Bi, Niskayuna, NY (US); Hung H. Tran, Chicago, IL (US); Zheng Xu, Wappingers Falls, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/288,850

(22) Filed: Oct. 7, 2016

(51) Int. Cl.
| | |
|---|---|
| H03B 5/08 | (2006.01) |
| H03B 5/12 | (2006.01) |
| H03L 7/099 | (2006.01) |
| H01F 41/06 | (2016.01) |
| H03H 7/01 | (2006.01) |
| H01L 27/06 | (2006.01) |
| H03H 7/42 | (2006.01) |
| H01F 27/40 | (2006.01) |
| H01F 27/28 | (2006.01) |

(52) U.S. Cl.
CPC ....... *H03B 5/1243* (2013.01); *H01F 27/2823* (2013.01); *H01F 27/40* (2013.01); *H01F 41/06* (2013.01); *H01L 27/0676* (2013.01); *H03B 5/1225* (2013.01); *H03B 5/1228* (2013.01); *H03H 7/0115* (2013.01); *H03H 7/42* (2013.01); *H03L 7/099* (2013.01)

(58) Field of Classification Search
CPC ..... H01L 27/0676; H01F 27/40; H01F 41/06; H01F 27/2823; H03H 7/42; H03H 7/0115; H03B 5/1243; H03B 5/1225; H03B 5/1228; H03L 7/099

USPC .......... 257/531; 331/167, 117 FE; 333/185
See application file for complete search history.

(56) References Cited

U.S. PATENT DOCUMENTS

| | | | |
|---|---|---|---|
| 6,529,720 | B1 | 3/2003 | Jovenin et al. |
| 6,549,096 | B2 | 4/2003 | Groves et al. |
| 6,876,877 | B2 | 4/2005 | Eden |
| 7,002,233 | B2 | 2/2006 | Butaye et al. |
| 7,202,768 | B1 | 4/2007 | Harvey et al. |
| 7,968,973 | B2 * | 6/2011 | Jung .................. H01L 27/0676 257/601 |

(Continued)

FOREIGN PATENT DOCUMENTS

JP 2007005498 A 1/2007

OTHER PUBLICATIONS

Lu et al., "Wide Tunning Range 60 GHz VCO and 40 GHz DCO Using Single Variable Inductor", IEEE Transactions on Circuits and Systems I: Regular Papers, vol. 60, No. 2, Feb. 2013, pp. 257-267.

*Primary Examiner* — Arnold Kinkead
(74) *Attorney, Agent, or Firm* — Cantor Colburn LLP; Vazken Alexanian

(57) ABSTRACT

A method for controlling a semiconductor circuit, including forming an inductor and a capacitor on a substrate, which are inductively coupled to one another. The inductor has an inductance value while the capacitor has a capacitance value. The inductor and capacitor make up an oscillator circuit with two terminals. Eddy currents are generated through the capacitor when an operating current flows along the inductor. These eddy currents influence, by inductive coupling, the inductance value and performance of the oscillator circuit, thus simultaneously tuning the inductance and capacitance of the oscillator circuit.

18 Claims, 7 Drawing Sheets

(56) References Cited

U.S. PATENT DOCUMENTS

| | | | |
|---|---|---|---|
| 8,472,904 B2 | 6/2013 | White | |
| 8,963,674 B2 | 2/2015 | Lee et al. | |
| 9,225,051 B2 | 12/2015 | Guyette | |
| 9,330,214 B2 | 5/2016 | Valdes-Garcia et al. | |
| 9,520,220 B2* | 12/2016 | Yen | H01F 21/12 |
| 2009/0322447 A1* | 12/2009 | Daley | H01L 23/5223 |
| | | | 333/185 |
| 2013/0043557 A1* | 2/2013 | Cho | H01L 23/5223 |
| | | | 257/531 |

* cited by examiner

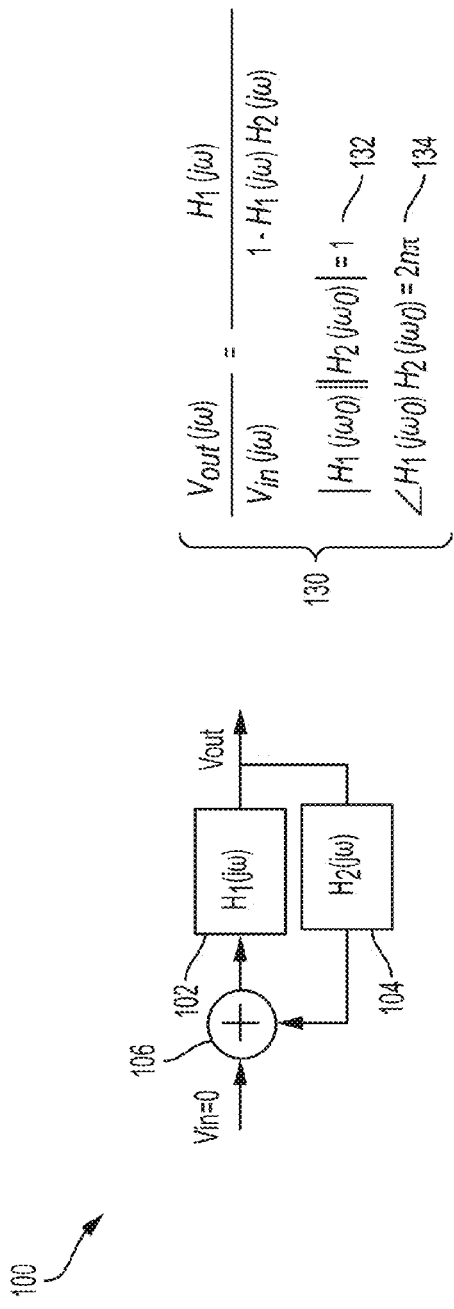
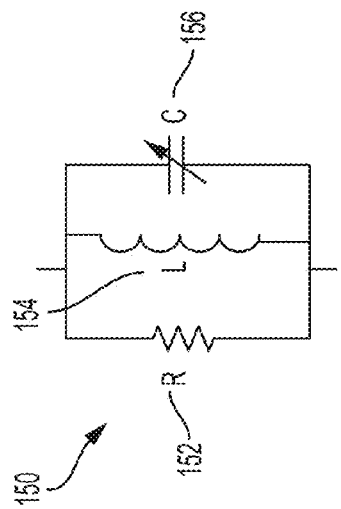
FIG. 1A
FIG. 1B
FIG. 2

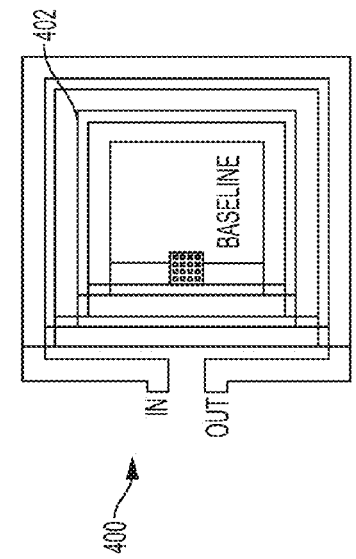
FIG. 6A
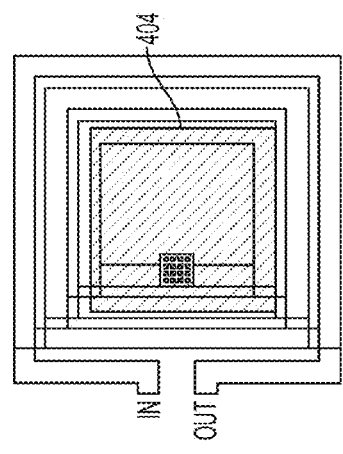
FIG. 6B
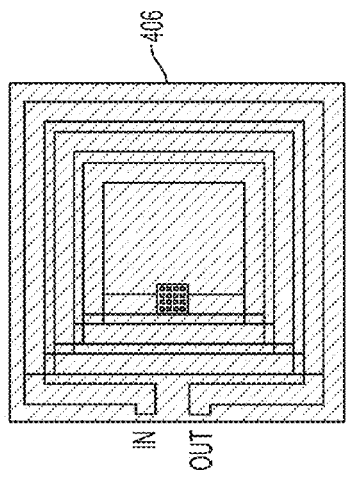
FIG. 6C
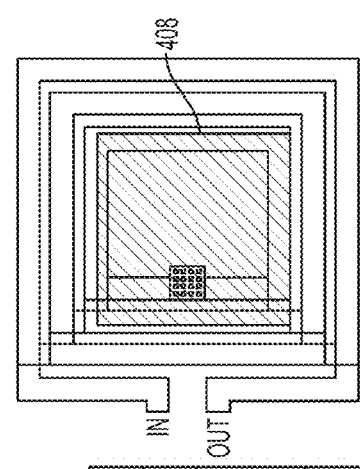
FIG. 6D
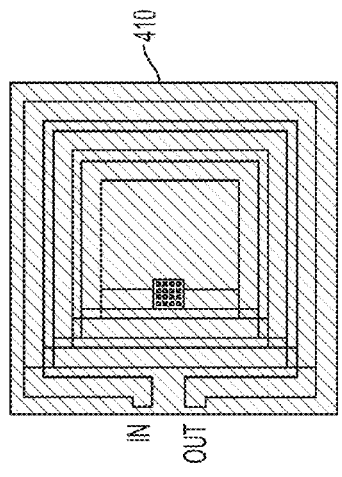
FIG. 6E
| VNCAP | LxW | LEVELS | C (fF) |
|---|---|---|---|
| (2) | 20 μ X 20 μ | K4 | 215 |
| (3) | 40 μ X 40 μ | K4 | 911 |
| (4) | 20 μ X 20 μ | K3-K4 | 438 |
| (5) | 40 μ X 40 μ | K3-K4 | 1912 |
FIG. 6F

600

| SAMPLE PT. | 20GHz VS BASELINE (1) | | | 40GHz VS BASELINE (1) | | |
|---|---|---|---|---|---|---|
| CONF. | L (nH) | DELTA L (%) | DELTA $F_{OSC\_L}$ (%) | L (nH) | DELTA L (%) | DELTA $F_{OSC\_L}$ (%) |
| (1) | 0.903 | / | / | 2.117 | / | / |
| (2) | 0.905 | 0.2% | -0.1% | 2.175 | 2.7% | -1.3% |
| (3) | 0.918 | 1.7% | -0.8% | 2.067 | -2.4% | 1.2% |
| (4) | 0.853 | -5.6% | 2.9% | 1.579 | -25.4% | 15.8% |
| (5) | 0.663 | -26.6% | 16.7% | 0.939 | -55.6% | 50.2% |

—·— w. vncap$_{1s}$
········ w. vncap$_{1b}$
---- w. vncap$_{2s}$
--- w. vncap$_{2b}$

FIG. 8

TUNING LC TANK CIRCUITS

BACKGROUND

The present invention generally relates to tuning oscillator circuits. More specifically, the present invention relates to methods and device architectures for controlling the performance of an oscillator circuit across a wide tuning range by concurrently varying eddy current flow and capacitance density.

Semiconductor LC tank oscillator circuits are used in communications systems, analog applications, and microprocessors as stable frequency generators with excellent power characteristics, stability, and low noise. Known LC tank circuits have independently-working inductors and capacitors, which do not affect each other during operation. A known approach to tuning LC tank circuits is by varying capacitance values.

SUMMARY

Embodiments are directed to a method for controlling a semiconductor circuit, the method including forming an inductor and a capacitor on a substrate, where the inductor and capacitor are inductively coupled to one another. The inductor includes an inductance value and the capacitor includes a capacitance value and together, the inductor and capacitor creates an oscillator circuit with two terminals. Eddy currents are formed when sending an operating current through the terminals of the oscillator circuit. The eddy current influences, by inductive coupling, the inductance value, the current through the inductor and the capacitor, and performance of the oscillator circuit, thus simultaneously tuning the oscillator circuit.

Embodiments are also directed to a semiconductor device having an inductor fabricated on a substrate with an inductance value and a capacitor fabricated on the substrate having a capacitance value. The capacitor is inductively coupled to the inductor, resulting in an oscillator circuit, made up of the inductor, capacitor, and two terminals. An operating current flows through the inductor and generates eddy currents on the underlying capacitor that is inductively coupled to the inductor.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

FIG. 1A depicts a block diagram of a negative feedback circuit according to one or more embodiments of the present invention;

FIG. 1B depicts mathematical equations relating to resonant frequencies of negative feedback circuits according to one or more embodiments of the present invention;

FIG. 2 depicts a schematic diagram of a resonance-type oscillator according to one or more embodiments of the present invention;

FIG. 6A depicts a top-down view of an inductor on a semiconductor substrate according to one or more embodiments of the present invention;

FIG. 6B depicts a top-down view of an inductor/capacitor arrangement on a semiconductor substrate using a small-footprint, single layer capacitor according to one or more embodiments of the present invention;

FIG. 6C depicts a top-down view of an inductor/capacitor arrangement on a semiconductor substrate using a large-footprint, single layer capacitor according to one or more embodiments of the present invention;

FIG. 6D depicts a top-down view of an inductor/capacitor arrangement on a semiconductor substrate using a small-footprint, multiple layer capacitor according to one or more embodiments of the present invention;

FIG. 6E depicts a top-down view of an inductor/capacitor arrangement on a semiconductor substrate using a large-footprint, multiple layer capacitor according to one or more embodiments of the present invention;

FIG. 6F depicts a chart showing various dimensions of VNCAPs and their capacitance values as a function of area according to one or more embodiments of the present invention;

FIG. 8 depicts a chart showing inductance and changes in inductance values for various capacitance values for two resonant frequencies according to one or more embodiments of the present invention.

DETAILED DESCRIPTION

Figure 3A:
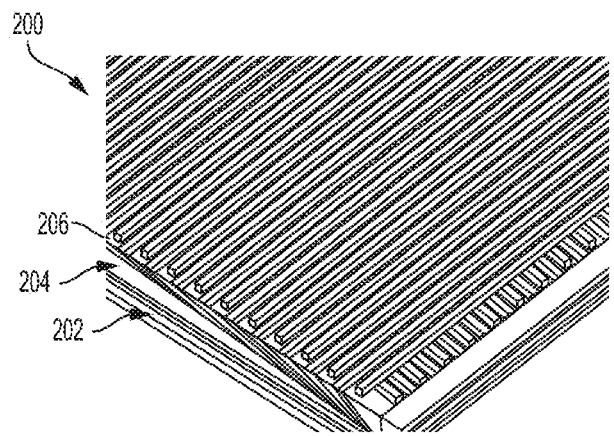
FIG. 3A depicts a cross-sectional view of a vertical natural capacitor (VNCAP) fabricated on a substrate according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication can be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to embodiments of the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, an LC circuit, also called an oscillator circuit, resonant circuit, tank circuit, or tuned circuit, is an electric circuit having an inductor (L) and a capacitor (C) connected together. The circuit can act as an electrical resonator that stores energy oscillating at the circuit's resonant frequency. LC circuits are used for either generating signals at a particular frequency or for picking out a signal at a particular frequency from a more complex signal. They are used in many electronic devices, including, for example, radio equipment, oscillators, filters, tuners, and frequency mixers. However, it is difficult to change the inductance of the circuit once fabricated. Thus limited, the resonant frequency range of a LC tank circuit is restricted in relation to the range of available capacitance and inductance values.

As previously noted herein, known LC tank circuits have independently working inductors and capacitors, which do not affect each other during operation. A known approach to tuning LC tank circuits is by varying capacitance values. However, it is difficult to change the inductance of the circuit once fabricated. Thus limited, the resonant frequency range of known LC tank circuits is restricted in relation to the range of available capacitance values.

Turning now to an overview of aspects of the present invention, embodiments of the present invention implement a variable capacitance component of LC circuits using vertical natural capacitors (VNCAPs), which are metal finger capacitors utilizing lateral and vertical capacitive couplings. VNCAPs possess high capacitance density and low equivalent series resistance and are readily formed using standard CMOS fabrication methods. VNCAPs, used as variable capacitors in a LC circuit in either a single layer/stack or multiple layers/stacks, provide inductor-induced eddy current loops that affect inductor performance backwards. Compared to a conventional LC tank circuit, the reconfigurable VNCAP-based LC circuit changes both the capacitance value and the inductance value simultaneously and increases the effective oscillating or resonant frequency of the LC circuit. Finally, the fabrication of the LC circuit, including the VNCAP and the inductor, is compatible with any standard CMOS fabrication process.

Turning now to a more detailed description of aspects of the present invention, methods for controlling a semiconductor circuit and the resulting structures therefrom in accordance with embodiments of the present invention are described in detail below by referring to the accompanying drawings in FIGS. 1A-9. Specifically, FIG. 1A depicts a block diagram of a negative feedback circuit 100 according to one or more embodiments of the present invention. The negative feedback circuit 100 includes a function block 102 containing transfer function $H_i(j\omega)$, where the frequency of interest is $\omega$ and the output is $V_{out}$. The circuit also includes a negative feedback loop 104, which has $V_{out}$ as an input, and a second transfer function $H_2(j\omega)$ which acts on the $V_{out}$ signal. The negative feedback loop 104 output is summed using a sum function 106 with the circuit 100 input $V_{in}$ and fed back into the function block 102. Negative feedback occurs when some function of the output of a system, process, or mechanism is fed back in a manner that tends to reduce the fluctuations in the output, whether caused by changes in the input or by other disturbances.

FIG. 1B depicts mathematical equations 130 relating to resonant frequencies of negative feedback circuits according to one or more embodiments of the present invention. Equations 130 depict Barkhausen's Stability Criteria in mathematical form. Equation 132 shows that a circuit will sustain steady-state oscillations only at frequencies for which the loop gain is equal to 1, and equation 134 shows that, in order to sustain steady-state oscillations, the total phase must be a whole number ("n") multiple of $2\pi$. In electronics, the Barkhausen stability criteria are mathematical conditions to determine when a linear electronic circuit will oscillate. The criteria are widely used in the design of electronic oscillators, and also in the design of general negative feedback circuits to prevent them from oscillating.

FIG. 2 depicts a schematic diagram of a resonance-type oscillator 150 according to one or more embodiments of the present invention. Oscillator 150 is also known as a "LC tank" circuit with intrinsic resistive elements. LC tank 150 includes resistor "R" 152 with a resistance value, inductor "L" 154 with an inductance value, and variable capacitor "C" 156 with a capacitance value. In many applications, effects arising from the resistor R 152 are negligible over a short time period and can be ignored. The resonant frequency of the oscillator is defined as:

$$\omega = 1/\sqrt{LC} \qquad \text{Equation (1)}$$

where $\omega$ is the resonant frequency, L=the inductance value, and C=the capacitance value.

FIG. 3A depicts a cross-sectional view of a vertical natural capacitor (VNCAP) structure 200 fabricated on a substrate according to one or more embodiments of the present invention. The VNCAP includes "back-end-of-line" (BEOL) metal finger capacitor layers 202, 204, and 206 and can include more layers. The finger layers 202, 204, and 206 utilize lateral and vertical capacitive coupling and can be formed with micro widths of 1× (48 nm pitch), 1.25× (60 nm pitch), and 2× (96 nm pitch) metals. FIG. 3A displays three finger layers. Other embodiments can include more or fewer layers, including one to nine layers or more. Orientation of the VNCAP's metal finger layers 202, 204, and 206 alternates in a different radial direction on every layer, producing a high density capacitor with low equivalent series resistance (ESR), and with minimal temperature dependence, while having a similar footprint area as other planar capacitor formation processes. The VNCAPs in LC tank circuits as described herein also allows the VNCAP to act as a natural metal ground plane for the inductors, and therefore varying performance of the inductor.

Figure 3B:
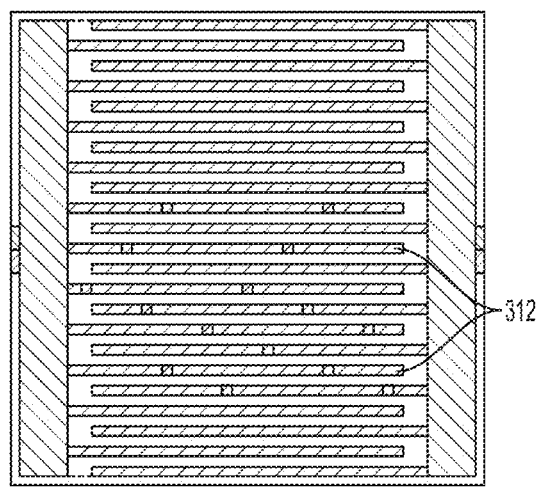
FIG. 3B depicts a top-down view of a semiconductor structure with a horizontal finger alignment according to one or more embodiments of the present invention.

FIG. 3B depicts a top-down view of a semiconductor structure 310 with a horizontal finger alignment according to one or more embodiments of the present invention. The structure 310 is one layer of a VNCAP 200 of FIG. 3A. The VNCAP 200 capacitor structure 310 includes "back-end-of-line" (BEOL) metal fingers 312 oriented in a horizontal alignment. The orientation of the metal fingers to one another contribute to the total capacitance value of the VNCAP.

Figure 3C:
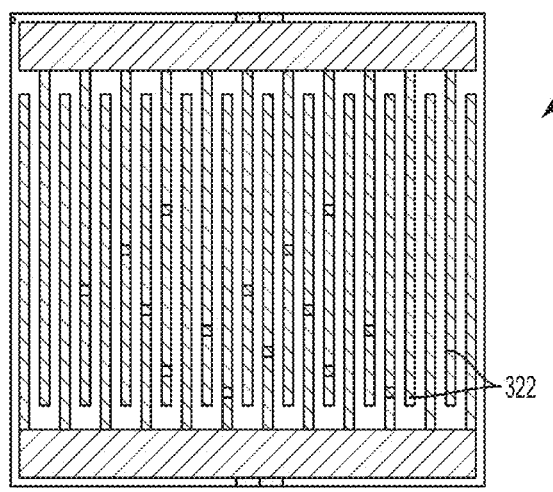
FIG. 3C depicts a top-down view of a semiconductor structure with a vertical finger alignment according to one or more embodiments of the present invention.

Likewise, FIG. 3C depicts a top-down view of a semiconductor structure 320 with a vertical finger alignment according to one or more embodiments of the present invention. The structure 320 is an additional layer of a VNCAP 200 of FIG. 3A. The VNCAP capacitor structure 320 includes "back-end-of-line" (BEOL) metal fingers 322 oriented in a vertical alignment. Thus described, structure 310 of FIG. 3B is aligned with structure 320 with the fingers 312 of FIG. 3B orthogonally aligned with fingers 322. Orientation of one layer to another layer also contributes to the total capacitance value of the VNCAP.

Figure 4:
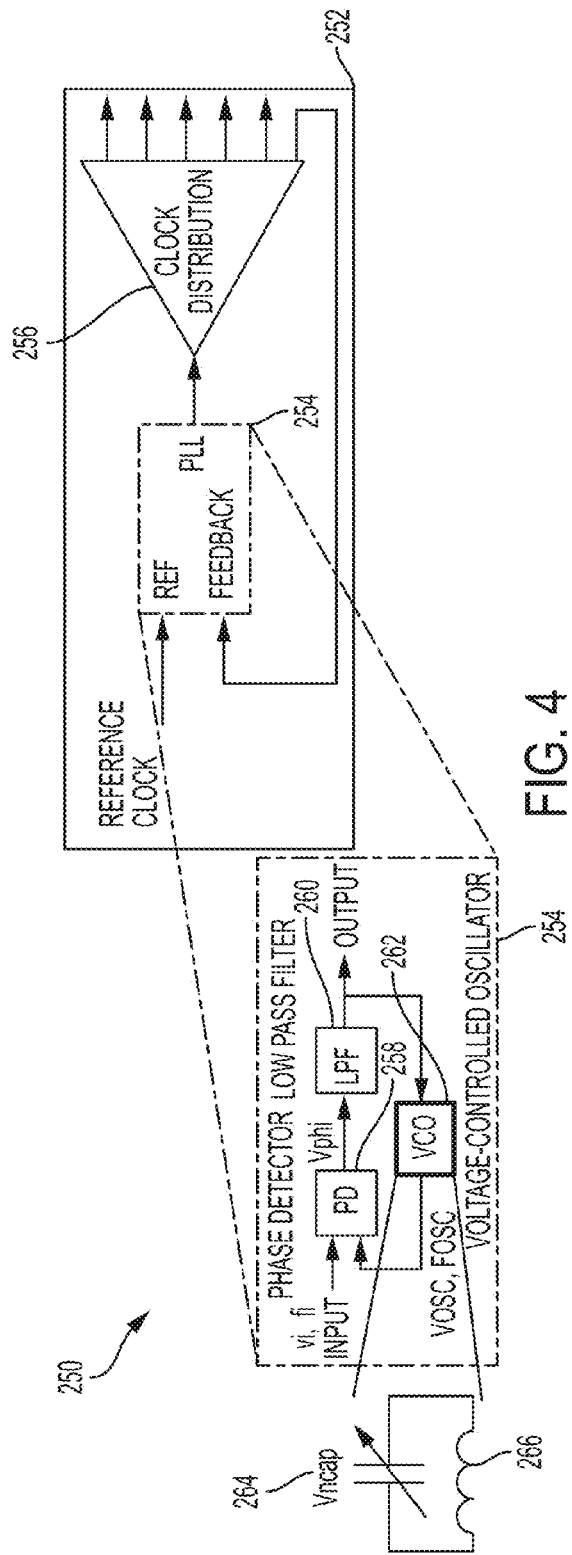
FIG. 4 depicts a block diagram of a clock generating circuit employing VNCAPs according to one or more embodiments of the present invention.

FIG. 4 depicts a block diagram of a clock generating circuit diagram 250 employing VNCAPs in oscillator circuits according to one or more embodiments of the present invention. Clock circuit 250 includes a reference clock functional block 252 that includes a phase locked loop (PLL) oscillator 254 and a clock distribution block 256. The PLL oscillator 254 receives, as an input, a reference clock input signal and a negative feedback signal from the clock distribution block 256, while the output is a clock signal for use outside the circuit. The clock distribution block 256 distributes the output of the PLL oscillator 254 to outside the reference clock functional block 252, and also sends the negative feedback signal to the input of the PLL oscillator 254.

Additional details of the PLL oscillator 254 are described further. The PLL oscillator 254 includes a phase detector 258, a low pass filter 260, and a voltage-controlled oscillator (VCO) 262. Embodiments of the present invention place the LC tank oscillator 150 of FIG. 2 as the VCO 262. The VCO 262 includes a VNCAP 264 and inductor 266 in the same arrangement and orientation as the inductor 154 and variable capacitor 156 of the LC tank circuit 150 of FIG. 2. Embodiments of the present invention include using VNCAP 200 (of FIG. 3A) as the variable capacitor 264. As employed, VNCAPs can be used in switched capacitor banks to generate a variable capacitance, and result in high-frequency clock signals and low clock data recovery (CDR) times.

Figure 5A:
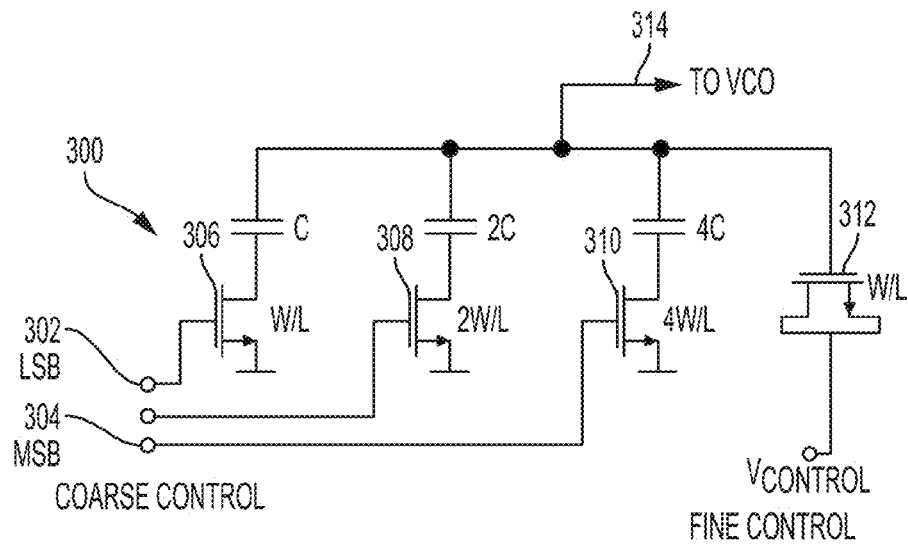
FIG. 5A depicts a schematic diagram of a variable capacitor with coarse and fine control according to one or more embodiments of the present invention.

FIG. 5A depicts a schematic diagram of a variable capacitor 300 with coarse and fine control according to one or more embodiments of the present invention. The variable capacitor 300 includes four stages including three coarse stages 306, 308, and 310 and one fine control stage 312. Each stage includes a capacitor and a control gate which is turned on or off depending on the control bit sent to that stage. Each stage is activated or deactivated by a single bit signal. Each stage can have identical capacitance values, or can have different values depending on the particular application. In the embodiment displayed in FIG. 5A, the first stage 306 has a capacitance of "C" while the second stage 308 has a capacitance value of "2C" and the third stage 310 has a value of "4C" Likewise, the fourth fine control stage 312 employs a varactor, which are used as a voltage-controlled capacitor. Varactors are commonly used in voltage-controlled oscillators, parametric amplifiers, and frequency multipliers. A MOS-based varactor or "MOSVAR" is used in embodiments of the present invention for minute changes, or fine control, of total circuit capacitance. For coarse control, least significant bit (LSB) 302 and most significant bit (MSB) 304 allow for control and activation of two or more stages by a user selecting the appropriate bit-word and applying that word to the appropriate stages. In embodiments of the present invention, three bits control the three stages, but more or fewer stages are possible and the present figure and description does not limit the scope of these embodiments. The output of the variable capacitor 300 is a single overall capacitance value that is sent to the VCO 262 (of FIG. 4) for use as a variable capacitor 156 (of FIG. 2) in the LC tank circuit 150 of FIG. 2.

Figure 5B:
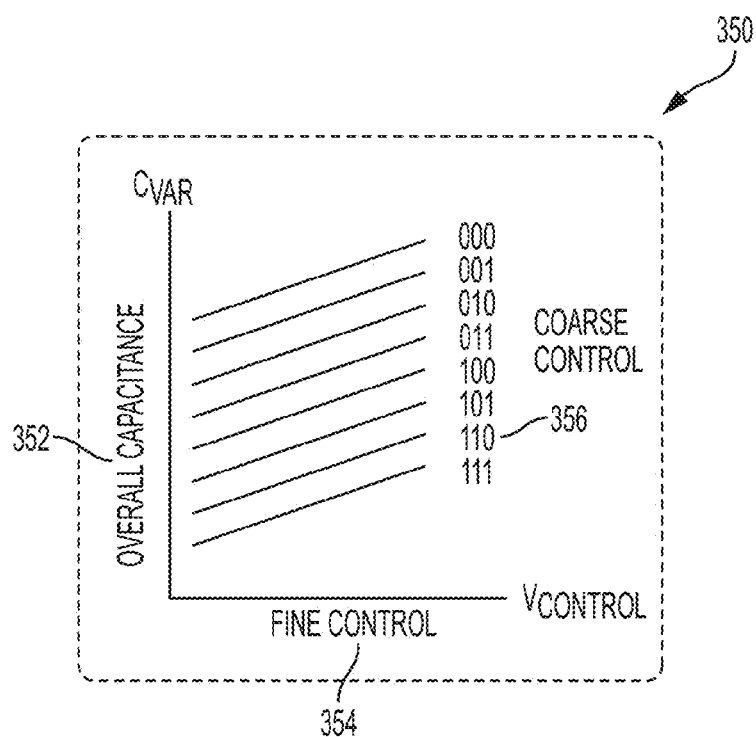
FIG. 5B depicts a graph of capacitance values as a function of various control signals according to one or more embodiments of the present invention.

FIG. 5B depicts graphs of capacitance values 350 as a function of various control signals according to one or more embodiments of the present invention. The control signals include the coarse and fine control bits 302, 304 of FIG. 5A and can include more bits. In the present description, three bits are shown, allowing for eight different bit words 356 that vary from 000 to 111. These bit words control the activation and deactivation of the coarse stages 306, 308, 310 of FIG. 5A, and generate an overall capacitance as shown in the graphs 352. Fine control 354 allows for adjustments to be made along a particular graph as chosen by one of the eight bit words 356 and is controlled by voltage control signal controlling the fine control stage 312 of FIG. 5A.

FIGS. 6A-6E depicts top-down views of several embodiments of inductor/capacitor arrangements 400 on a semiconductor substrate according to one or more embodiments of the present invention. In some embodiments of the present invention, the capacitor can be located underneath the inductor. In the following figures, the inductor is located underneath the capacitor.

FIG. 6A depicts an inductor 402 on a semiconductor substrate as a baseline figure. Inductor 402 includes an outer dimension of 36 um, number of turns=3, width w=3.6 um, and spacing s=1.2 um.

FIG. 6B depicts a VNCAP 404 fabricated on top of the inductor. VNCAP 404 includes a single layer of metal fingers with dimensions of 20 um×20 um, as described earlier in FIG. 3.

Meanwhile, FIG. 6C depicts VNCAP 606 with a single layer with dimensions of 40 um×40 um over the inductor.

Moving to FIG. 6D, VNCAP 408 includes two layers and dimensions of 20 um×20 um.

Finally, FIG. 6E depicts a VNCAP 410 including two layers and with dimensions 40 um×40 um. The foregoing embodiments are examples and are not limiting. Additional layers and dimensions are possible.

FIG. 6F depicts a chart 450 showing various dimensions of VNCAPs and their capacitance values as depicted in FIGS. 6A-6E as a function of area according to one or more embodiments of the present invention. In the embodiments described, VNCAPs 404, 406, 408, and 410 have a capacitance of 215, 911, 438, and 1912 femtofarads, respectfully (femtofarads is abbreviated as "fF", a SI unit of electrical capacitance equal to $10^{-15}$ farads).

Figure 7C:
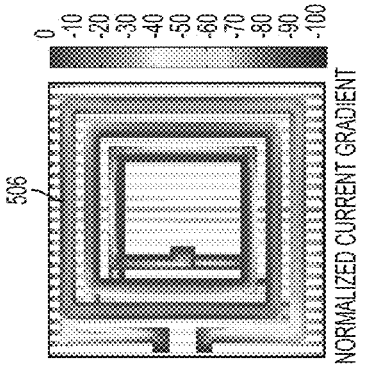
FIG. 7C depicts a top-down view of an inductor/capacitor arrangement on a semiconductor substrate and associated inductances using a large-footprint, single layer capacitor according to one or more embodiments of the present invention.
Figure 7E:
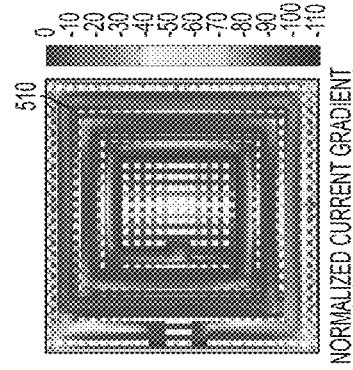
FIG. 7E depicts a top-down view of an inductor/capacitor arrangement on a semiconductor substrate and associated inductances using a large-footprint, multiple layer capacitor according to one or more embodiments of the present invention.
Figure 7B:
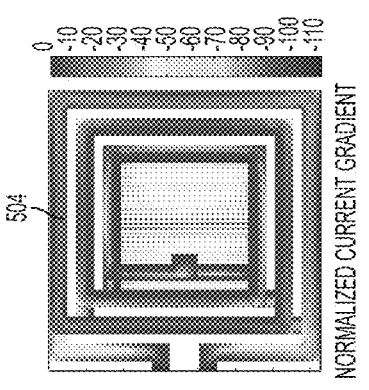
FIG. 7B depicts a top-down view of an inductor/capacitor arrangement on a semiconductor substrate and associated inductances using a small-footprint, single layer capacitor according to one or more embodiments of the present invention.
Figure 7D:
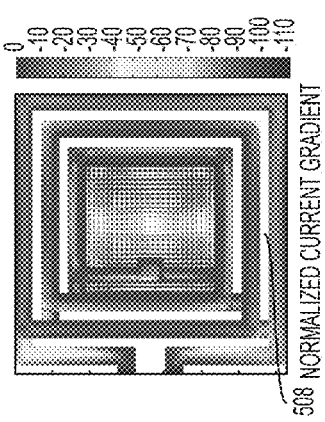
FIG. 7D depicts a top-down view of an inductor/capacitor arrangement on a semiconductor substrate and associated inductances using a small-footprint, multiple layer capacitor according to one or more embodiments of the present invention.
Figure 7A:
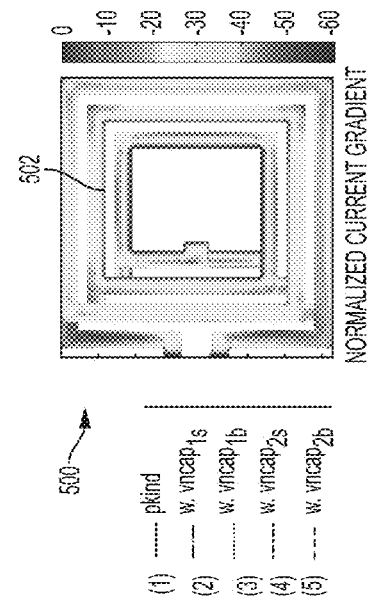
FIG. 7A depicts a top-down view of an inductor on a semiconductor substrate and associated inductances according to one or more embodiments of the present invention.

FIG. 7A depicts an inductor 502 and is shown as a baseline. Inductor 502 parameters include an outside dimension of 36 um, number of turns=3, width w=3.6 um, and spacing s=1.2 um.

FIG. 7B, meanwhile, depicts a VNCAP 504 with a single layer that is 20 um×20 um in size and the resultant current contours.

FIG. 7C depicts a VNCAP 506 with a single layer and 40 um×40 um in size and the resultant current contours.

FIG. 7D depicts a VNCAP 508 with two layers and 20 um×20 um in size and the resultant current contours.

Finally, FIG. 7E depicts VNCAP 510s with two layers and 40 um×40 um in size and the resultant current contours.

Figure 7F:
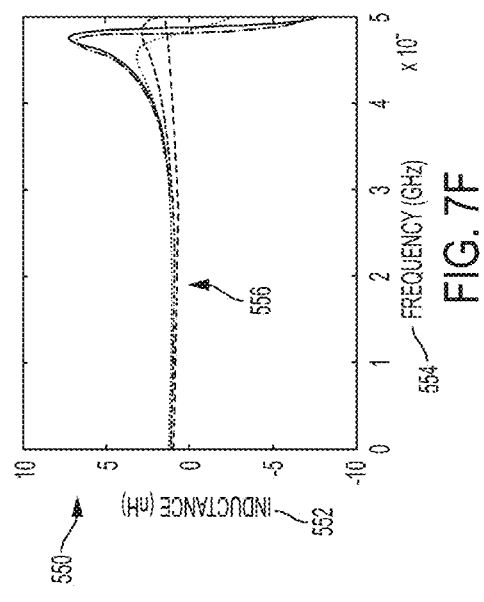
FIG. 7F depicts a graph of inductances as a function of frequency for a semiconductor LC tank circuit employing VNCAPs according to one or more embodiments of the present invention.

FIG. 7F depicts a graph 550 of inductances as a function of frequency for a semiconductor LC tank circuit employing VNCAPs according to one or more embodiments of the present invention. The graph 550 plots inductance values 552 on the y-axis as a function of frequency 554 on the x-axis. Prior to embodiments of the present invention, inductance values in a LC circuit were generally constant and unvarying over a change in frequency. However, in graphs 556, it is shown that using VNCAPs as variable capacitors in LC circuits creates variations in inductance values as frequencies increase past 30 GHz. This effect is due to the influence of eddy currents induced inside the VNCAPs as described in the preceding figures.

FIG. 8 depicts a chart 600 showing inductances and changes in inductance values for various capacitance values for two resonant frequencies according to one or more embodiments of the present invention. The frequencies involved are 20 GHz and 40 GHz as examples. The sample points utilize the same inductor and VNCAPs as described in FIGS. 6A-6E. In the chart 600, it is shown that inductance values differ significantly with a change in operating frequency and also with a change in capacitance values. Inductance values can decrease up to 55%, and the resultant resonant frequency increases by over 50% without any physical change in the structure of the LC circuit. This is significant in that the inductor in the foregoing embodiment has not been modified in any way. Therefore, the conclusion is that changes in capacitance current and operating frequencies can cause changes in inductance values.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. Embodiments of the present invention has been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections there between. All of these variations are considered a part of the invention.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such described embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A method for controlling a semiconductor circuit, the method comprising:
    forming an inductor and a capacitor on a substrate, wherein the capacitor comprises a plurality of semiconductor devices, and the capacitor comprises four stages of variable capacitance control, the devices creating multiple eddy current-generating sources, wherein the inductor and capacitor inductively are coupled to one another, wherein the inductor includes an inductance value and the capacitor includes a capacitance value, and wherein the inductor and capacitor define an oscillator circuit possessing two terminals;
    sending an operating current through the terminals of the oscillator circuit, wherein eddy currents are generated by the operating current transiting the inductor; and
    influencing, by inductive coupling of the eddy currents, the inductance value and performance of the oscillator circuit, thus simultaneously tuning the inductance value of the oscillator circuit.

2. The method of claim 1, wherein the capacitance value is modified by varying capacitance density.

3. The method of claim 1, wherein the inductor and capacitor are physically positioned in a vertical stack arrangement.

4. The method of claim 1, wherein the capacitor acts as a natural metal ground plane for the inductor.

5. The method of claim 1, wherein the capacitor comprises a vertical natural capacitor (VNCAP).

6. The method of claim 1, wherein the effects of inductive coupling of the inductor by the eddy current increases the effective operating frequency of the oscillator circuit.

7. The method of claim 1, wherein the inductor and capacitor are formed using standard CMOS fabrication processes.

8. The method of claim 1, wherein varying the physical position of the inductor in relation to the capacitor enables the oscillator circuit to be tuned to a desired resonant frequency.

9. The method of claim 1, further comprising a FET/MOS-based varactor switch to allow for additional tuning of the oscillator circuit.

10. A semiconductor device comprising:
    an inductor fabricated on a substrate and having an inductance value;
    a capacitor fabricated on the substrate and having a capacitance value, wherein the capacitor comprises a plurality of semiconductor devices, the devices creating multiple eddy current-generating sources, and the capacitor comprises four stages of variable capacitance control, wherein the capacitor is inductively coupled to the inductor; and an oscillator circuit, comprised of the inductor, capacitor, and two terminals, wherein an operating current flows through the capacitor and generates eddy currents that are inductively coupled to the inductor.

11. The device of claim 10, wherein the capacitance value is modified by varying capacitance density.

12. The device of claim 10, wherein the inductor and capacitor are physically positioned in a vertical stack arrangement.

13. The device of claim 10, wherein the capacitor acts as a natural metal ground plane for the inductor.

14. The device of claim 10, wherein the capacitor comprises a vertical natural capacitor (VNCAP).

15. The device of claim 10, wherein the effects of inductive coupling of the inductor by the eddy current increases the effective operating frequency of the oscillator circuit.

16. The device of claim 10, further comprising multiple capacitor devices of different capacitance values that can be selected in order to select amongst a range of capacitance values of the oscillator circuit.

17. The device of claim 10, wherein varying the physical position of the inductor in relation to the capacitor allows tuning of the oscillator circuit to a desired resonant frequency.

18. The device of claim 10, further comprising a FET/MOS-based varactor switch to allow for additional tuning of the oscillator circuit.

* * * * *